(12) United States Patent
Lee et al.

(10) Patent No.: US 7,671,640 B2
(45) Date of Patent: Mar. 2, 2010

(54) DIRECT INJECTION-LOCKED FREQUENCY DIVIDER CIRCUIT WITH INDUCTIVE-COUPLING FEEDBACK ARCHITECTURE

(75) Inventors: Wei-Yang Lee, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 5 days.

(21) Appl. No.: 12/143,982

(22) Filed: Jun. 23, 2008

(65) Prior Publication Data

US 2009/0102520 A1 Apr. 23, 2009

(30) Foreign Application Priority Data

Oct. 18, 2007 (TW) .............................. 96138968 A

(51) Int. Cl.
*H03K 21/00* (2006.01)
(52) U.S. Cl. .................... 327/115; 327/117; 327/118; 327/551; 331/51; 331/172
(58) Field of Classification Search ................. 327/115, 327/117, 118, 551; 331/51, 117 R, 167, 331/172
See application file for complete search history.

(56) References Cited

U.S. PATENT DOCUMENTS

| 6,326,854 | B1 * | 12/2001 | Nicholls et al. | ............... 331/56 |
| 7,414,481 | B2 * | 8/2008 | Li et al. | ...................... 330/311 |
| 2001/0015449 | A1 * | 8/2001 | Nguyen et al. | ............. 257/296 |
| 2008/0042766 | A1 * | 2/2008 | Tarng et al. | .................. 331/167 |
| 2008/0074199 | A1 * | 3/2008 | Jang et al. | ...................... 331/16 |
| 2009/0146751 | A1 * | 6/2009 | Pernia et al. | ............ 331/117 R |

OTHER PUBLICATIONS

"A Wide Locking Range and Low Voltage CMOS Direct Injection-Locked Frequency Divider", Y.-H. Chuang, S.-H. Lee, R.-H. Yen, S.-L. Jang, J.-F. Lee, and M.-H. Juang, IEEE Microwave and Wireless Components Letfers, vol. 16, No. 5, May 2006, pp. 299-301.*

* cited by examiner

*Primary Examiner*—Long Nguyen
*Assistant Examiner*—Shikha Goyal
(74) *Attorney, Agent, or Firm*—Pearne & Gordon LLP

(57) ABSTRACT

A direct injection-locked frequency divider circuit with inductive-coupling feedback architecture is proposed, which is designed for integration to a high-frequency circuit system with a high operating frequency such as 24 GHz (gigahertz), for providing a frequency-dividing function. The proposed frequency divider circuit comprises an injection-locked oscillator (ILO) circuit module and a pair of buffer-stage circuits, wherein the ILO circuit module further includes a signal-injection circuit, a cross-coupled switching circuit, and a variable-capacitance tuning circuit. The proposed circuit architecture is characterized by the circuit arrangement of a direct-injection architecture and an inductive-coupling feedback architecture by coupling the inductive elements of the buffer-stage circuits to the inductive elements of the variable-capacitance tuning circuit in the ILO circuit module. These features allow the proposed frequency divider circuit to have higher operating frequency with wider frequency locking range, low power consumption, and small integrated circuit layout area.

4 Claims, 4 Drawing Sheets

DIRECT INJECTION-LOCKED FREQUENCY DIVIDER CIRCUIT WITH INDUCTIVE-COUPLING FEEDBACK ARCHITECTURE

BACKGROUND OF THE INVENTION

1. Field of the Invention

This invention relates to a direct injection-locked frequency divider circuit with inductive-coupling feedback architecture which is designed for integration to a high-frequency circuit system with a high operating frequency such as 24 GHz (gigahertz), for providing a frequency-dividing function.

2. Description of Related Art

With the advent of wireless digital communication technologies, such as wireless networking, mobile phones, GPS (Global Positioning System), and digital TV, the design and manufacture of high-speed digital circuits that operate with signals within the gigahertz range is in high demand in the electronics industry. Nowadays, the operating frequency of high-speed digital circuitry has advanced to the level of 24 GHz.

In the design of high-speed digital circuitry, frequency dividers are an important component that can provide a frequency-dividing function to generate an output signal whose frequency is a divide-by-N fraction of the input signal frequency. Presently, since most high-speed digital circuits are utilized on portable electronic devices, the circuit design typically requires low power consumption and small layout size. Moreover, in order to achieve high performance, the design of high-speed digital circuitry also demands low noise and wide frequency locking range.

SUMMARY OF THE INVENTION

It is therefore an objective of this invention to provide a new and improved frequency divider circuit which can operate with a low power consumption.

It is another objective of this invention to provide a frequency divider circuit which can be implemented with a smaller integrated circuit (IC) layout area so as to reduce IC manufacture cost.

In architecture, the frequency divider circuit with inductive-coupling feedback architecture according to the invention comprises: (A) an injection-locked oscillator (ILO) circuit module; and (B) a first buffer-stage circuit; and (C) a second buffer-stage circuit; and wherein the ILO circuit module includes: (A1) a signal-injection circuit; (A2) a cross-coupled switching circuit; and (A3) a variable-capacitance tuning circuit.

The direct injection-locked frequency divider circuit with inductive-coupling feedback architecture according to the invention has the following advantages: (1) First, since the signal-injection circuit is based on a direct-injection architecture rather than tail injection, it allows the frequency divider circuit of the invention to provide a higher operating frequency with a wider frequency locking range. (2) Second, since the buffer-stage circuits are PMOS-based rather NMOS-based, it allows the use of a lower bias voltage and thus allows the operation of the frequency divider circuit of the invention to consume less power. (3) Third, since the variable-capacitance tuning circuit utilizes a gate-interconnected pair of NMOS transistor, rather than transistor-inherent parasitic capacitance, it allows the frequency divider circuit of the invention to provide a wider frequency locking range for the input signal. (4) Fourth, since the inductive elements of the buffer-stage circuits are coupled to the inductive elements of the variable-capacitance tuning circuit to form an inductive-coupling feedback architecture, it allows the IC implementation of the invention to have a smaller layout area.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The direct injection-locked frequency divider circuit with inductive-coupling feedback architecture according to the invention is disclosed in full details by way of preferred embodiments in the following with reference to the accompanying drawings.

Application and Function of the Invention

Figure 1:
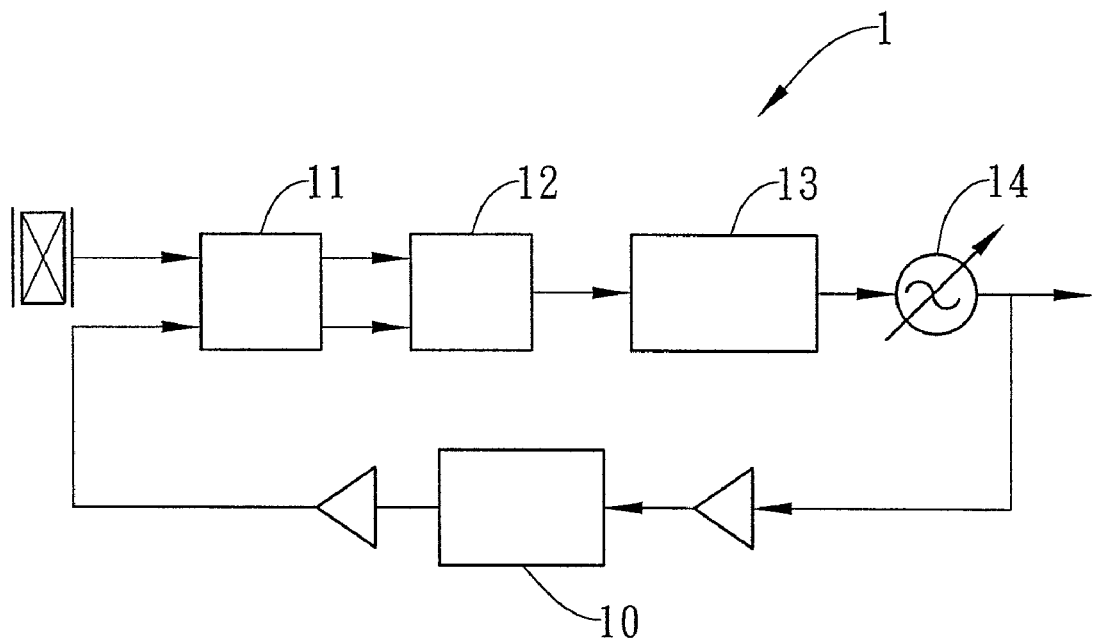
FIG. 1 is a schematic diagram showing an exemplary application of the frequency divider circuit of the invention.

FIG. 1 is a schematic diagram showing the application of the direct injection-locked frequency divider circuit of the invention (which is here encapsulated in a box indicated by the reference numeral 10, and is hereinafter referred in short as frequency divider circuit). In the example of FIG. 1, the frequency divider circuit of the invention 10 is designed for integration to the internal circuit architecture of a frequency synthesizer 1 which is based on a conventional architecture composed of, in addition to the frequency divider circuit of the invention 10, a phase/frequency detector 11, a charge pump 12, a loop filter 13, and voltage-controlled oscillator (VCO) 14. In operation, the frequency divider circuit of the invention 10 is used for providing a divide-by-2 frequency-dividing function to a high-frequency signal in the frequency synthesizer 1, such as a 24 GHz signal. Beside the example shown in FIG. 1, the frequency divider circuit of the invention 10 has various other applications with other types of circuit systems that require a frequency-dividing function.

Figure 2:
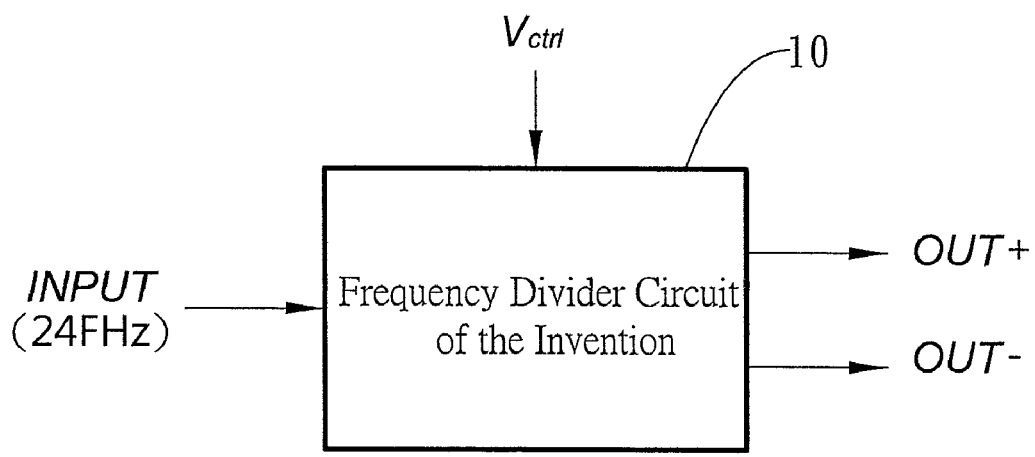
FIG. 2 is a schematic diagram showing the I/O functional model of the frequency divider circuit of the invention.

FIG. 2 shows the input/output (I/O) functional model of the frequency divider circuit of the invention 10. As shown, the frequency divider circuit of the invention 10 has an I/O interface which includes a signal-input port (INPUT), a control-voltage input port ($V_{crtl}$), and a pair of differential output ports including a positive differential output port (OUT+) and a negative differential output port (OUT−). In operation, the signal-input port (INPUT) is used for receiving an input signal (in this embodiment, a high-frequency signal in the range 24 GHz±10.09%) that is to be divided in frequency, while the paired differential output ports (OUT+, OUT−) are used for outputting a differential pair of output signals whose frequency is a divide-by-2 fraction of the input signal frequency. The control-voltage input port ($V_{crtl}$) is used for receiving a tuning-control voltage for control of the frequency locking range of the input signal.

Architecture of the Invention

Figure 3:
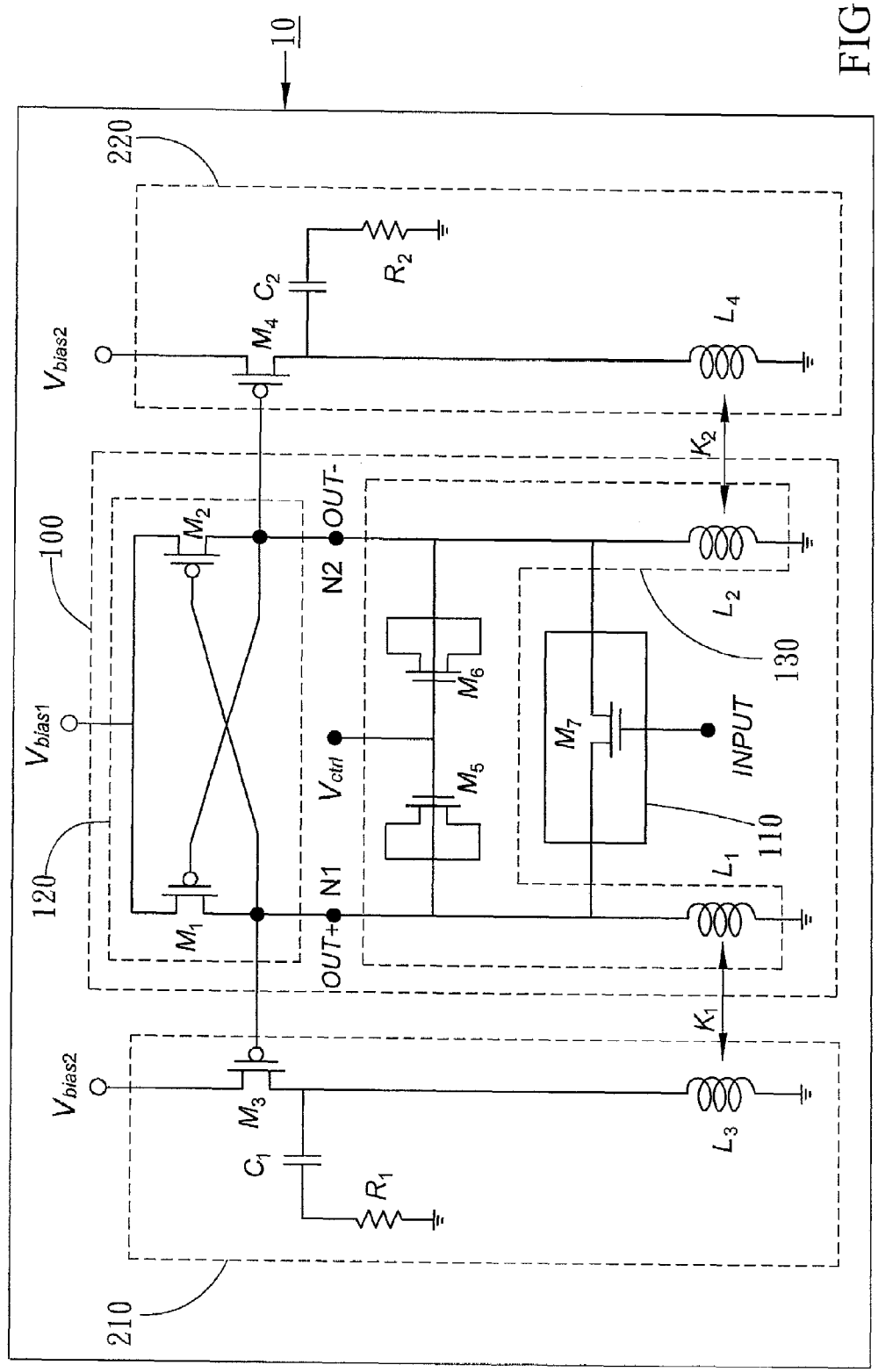
FIG. 3 is a schematic diagram showing the internal architecture of the frequency divider circuit of the invention.

As shown in FIG. 3, in architecture, the frequency divider circuit of the invention 10 comprises: (A) an injection-locked oscillator (ILO) circuit module 100; and (B) a first buffer-stage circuit 210; and (C) a second buffer-stage circuit 220; wherein the ILO circuit module 100 includes: (A1) a signal-injection circuit 110; (A2) a cross-coupled switching circuit 120; and (A3) a variable-capacitance tuning circuit 130. Firstly, the respective attributes and functions of these constituent components of the invention are described in details in the following.

Injection-Locked Oscillator (ILO) Circuit Module 100

The ILO circuit module 100 is a conventional oscillator circuit whose I/O interface includes a signal-input port (INPUT), a control-voltage input port ($V_{crtl}$), and a pair of differential output ports (OUT+, OUT−). The ILO circuit module 100 is based on a conventional architecture composed of a signal-injection circuit 110, a cross-coupled switching circuit 120, and a variable-capacitance tuning circuit 130.

The signal-injection circuit 110 is implemented with a switching element, such as an NMOS transistor ($M_7$), whose gate is connected to the signal-input port (INPUT), and whose source and drain are connected to a first node (N1) and a second node (N2), respectively. This type of signal injection is customarily referred to as "direct injection". On the other hand, if the signal-injection switching element is instead connected between the first bias voltage $V_{bias1}$ and the two switching element ($M_1$, $M_2$) of the cross-coupled switching circuit 120 (this connection scheme is not shown in the drawing), this type of signal injection is customarily referred to as "tail injection". In practice, however, the tail-injection type of circuit architecture would cause parasitic capacitance in the drain of the transistor, thus undesirably lowering the frequency locking range of the input signal. For this sake, the direct injection type of circuit architecture is more preferable to use than tail injection.

The cross-coupled switching circuit 120 includes a cross-coupled switching elements, such as a pair of PMOS transistors ($M_1$, $M_2$). In circuit arrangement, the first PMOS transistor ($M_1$) is connected in such a manner that its gate is connected to the second node (N2), its source is connected to the first bias voltage ($V_{bias1}$), and its drain is connected to the first node (N1); while the second PMOS transistor ($M_2$) is connected in such a manner that its gate is connected to the positive differential output port (OUT+), its source is also connected to the first bias voltage ($V_{bias1}$), and its drain is connected to the second node (N2). In operation, this cross-coupled switching circuit 120 is used in combination with the variable-capacitance tuning circuit 130 to provide a cross-coupled LC oscillating function in response to input signal injected via the signal-injection circuit 110.

The variable-capacitance tuning circuit 130 is implemented with a pair of NMOS transistors ($M_5$, $M_6$), a first inductive element ($L_1$), and a second inductive element ($L_2$). In circuit arrangement, the left NMOS transistor ($M_5$) is connected in such a manner that its gate is connected to the gate of the right NMOS transistor ($M_6$) and the control-voltage input port ($V_{crtl}$), its source is connected to the drain of itself, and its substrate is connected to the first node (N1); while the right NMOS transistor ($M_6$) is connected in such a manner that its gate is connected to the gate of the left NMOS transistor ($M_5$) and the control-voltage input port ($V_{crtl}$), its source is connected to the drain of itself, and its substrate is connected to the second node (N2). These two NMOS transistors ($M_5$, $M_6$) in combination constitute a voltage-controlled variable-capacitance circuit architecture that can provide a capacitance between the first node (N1) and the second node (N2) whose value is dependent on the control voltage $V_{crtl}$. Further, the first inductive element ($L_1$) is connected between the first node (N1) and the ground, while the second inductive element ($L_2$) is connected between the second node (N2) and the ground. In combination, the paired NMOS transistors ($M_5$, $M_6$) and the two inductive elements ($L_1$, $L_2$) constitute a variable-capacitance LC tuning circuit, which is capable of adjusting the frequency locking range of the input signal by adjusting the control voltage $V_{crtl}$. In this embodiment of the invention, for example, the control voltage $V_{crtl}$ can be set in the range from 0 V to 0.8 V. This variable-capacitance tuning circuit 130 can be substituted by other types of circuits having similar functionality. However, it has been found that the variable-capacitance tuning circuit 130 shown in FIG. 2 is able to provide a wider frequency locking range for the input signal, and therefore is most preferable to use.

First Buffer-Stage Circuit 210

The first buffer-stage circuit 210 is implemented with a circuit architecture composed of a PMOS transistor ($M_3$), a third inductive element ($L_3$), and an RC circuit ($R_1$, $C_1$). In circuit arrangement, the PMOS transistor ($M_3$) is connected in such a manner that its gate is connected to the positive differential output port (OUT+) of the ILO circuit module 100, its source is connected to a second bias voltage ($V_{bias2}$), and its drain is connected to both the third inductive element ($L_3$) and the RC circuit ($R_1$, $C_1$).

Second Buffer-Stage Circuit 220

The second buffer-stage circuit 220 is identical in circuit architecture to the above-mentioned first buffer-stage circuit 210, which includes a PMOS transistor ($M_4$), a fourth inductive element ($L_4$), and an RC circuit ($R_2$, $C_2$). In circuit arrangement, the PMOS transistor ($M_4$) is connected in such a manner that its gate is connected to the negative differential output port OUT− of the ILO circuit module 100, its source is connected to the second bias voltage ($V_{bias2}$), and its drain is connected to both the fourth inductive element ($L_4$) and the RC circuit ($R_2$, $C_2$).

Figure 4:
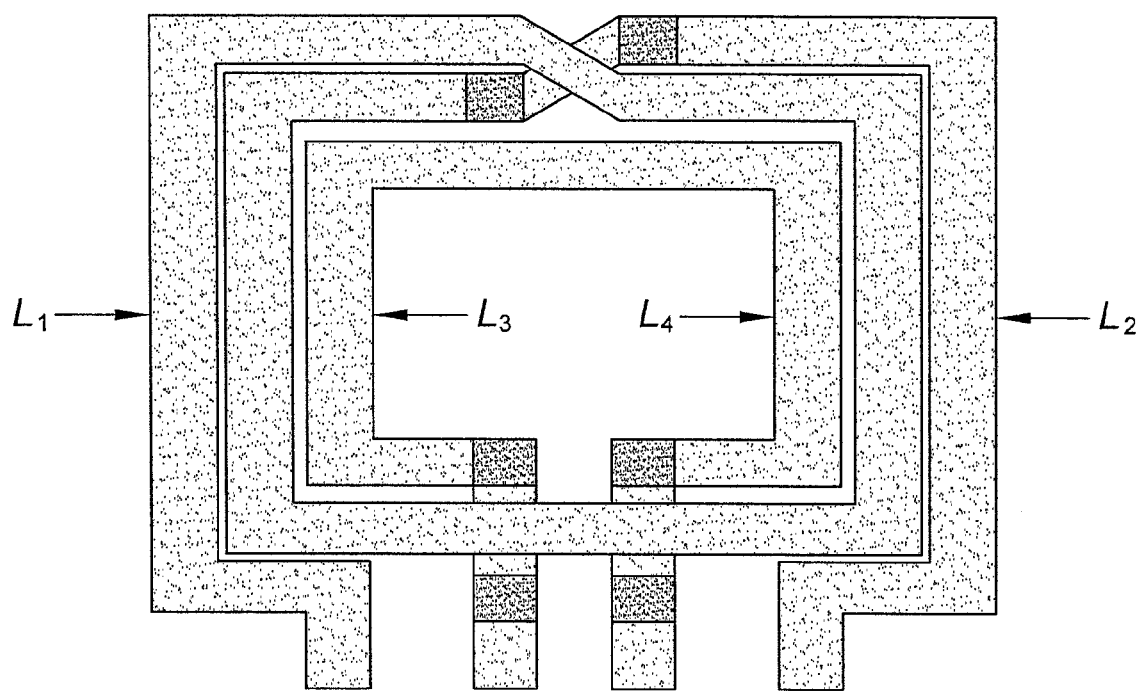
FIG. 4 is a schematic diagram showing a plan view of an IC layout scheme for implementing an inductive-coupling feedback architecture utilized by the frequency divider circuit of the invention.

The first buffer-stage circuit 210 and the second buffer-stage circuit 220 are used for providing a buffer effect to the output signals at the two differential output ports (OUT+, OUT−) to help reduce the overall power consumption by the frequency divider circuit of the invention 10. Since the use of PMOS transistors in the buffer-stage circuitry consumes less power than the use of NMOS transistors, the first buffer-stage circuit 210 and the second buffer-stage circuit 220 are preferably PMOS-based rather than NMOS-based. If the two PMOS transistors ($M_3$, $M_4$) are substituted by NMOS transistors, the operation of the buffer-stage circuits 210, 220 will consume more power. However, the utilization of PMOS transistors ($M_3$, $M_4$) requires the buffer-stage circuits 210 and 220 to be additionally attached with the third inductive element ($L_3$) and the fourth inductive element ($L_4$), respectively, thus undesirably increasing the overall IC layout area used for implementing the frequency divider circuit of the invention 10. To reduce the IC layout area, the invention proposes a solution as shown in FIG. 4 by arranging an inductive coupling ($K_1$) between the third inductive element ($L_3$) of the first buffer-stage circuit 210 and the first inductive element ($L_1$) of the variable-capacitance tuning circuit 130 in the ILO circuit module 100, and also an inductive coupling ($K_2$) between the fourth inductive element ($L_4$) of the second buffer-stage circuit 220 and the second inductive element ($L_2$) of the variable-capacitance tuning circuit 130. This circuit arrangement forms an inductive-coupling (also called transformer coupling) feedback architecture among the four inductive elements ($L_1$, $L_2$, $L_3$, $L_4$). This inductive-coupling feedback architecture can help reduce the overall circuit layout area. In practice, for example, if the invention is implemented with the 0.18 μm IC fabrication technology, the required chip size can be only 0.34 mm×0.45 mm.

Figure 5A:
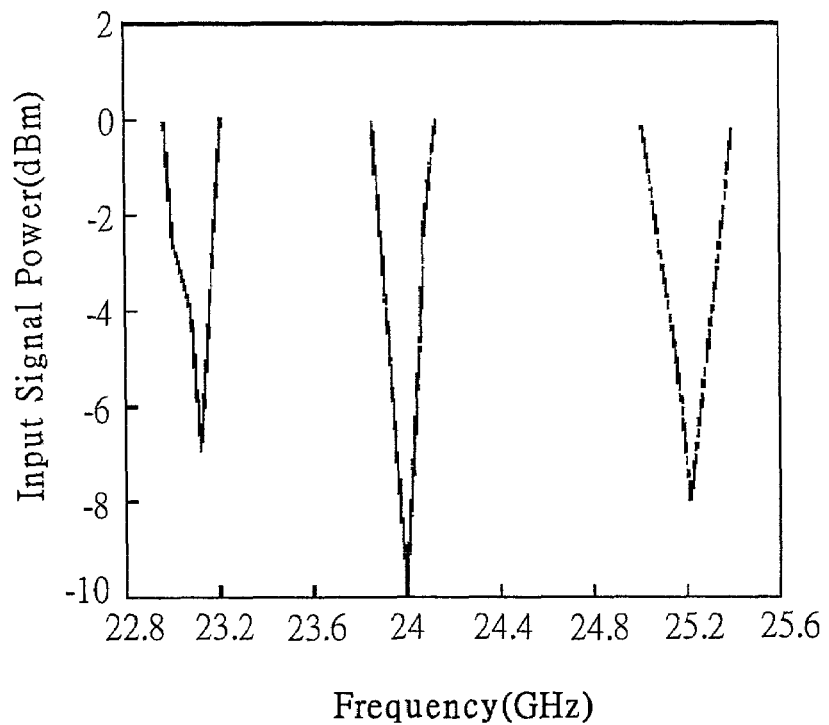
FIG. 5A is a graph showing a plot of input power versus frequency of the frequency divider circuit of the invention resulted from circuit simulation.

FIG. 5A is a graph showing a plot of input power versus frequency of the frequency divider circuit of the invention 10 resulted from circuit simulation. In the circuit simulation, the control voltage ($V_{crtl}$) is set to 3 different values: 0 V, 0.58 V, and 0.8V, respectively. As shown in the graph of FIG. 5A, in the case of $V_{crtl}$=0 V, it allows the frequency divider circuit of the invention 10 to operate with a maximum input signal frequency at 25.4 GHz; and in the case of $V_{crtl}$=0.8 V, a minimum input signal frequency at 22.96 GHz. In other words, the frequency divider circuit of the invention 10 can operate at a center frequency of 24 GHz with a frequency locking range of about ±10.09%.

Figure 5B:
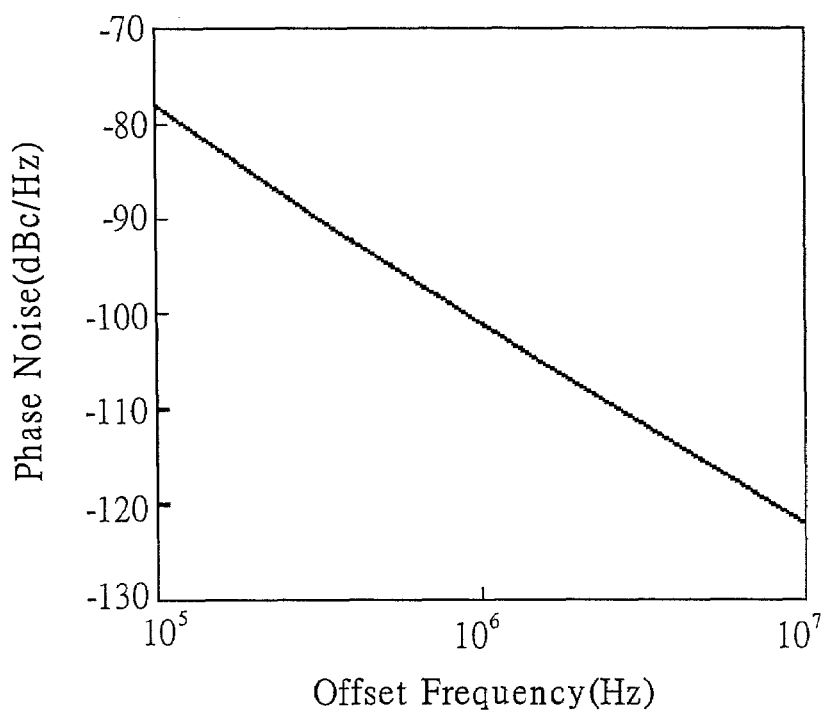
FIG. 5B is a graph showing a plot of phase noise versus offset frequency of the frequency divider circuit of the invention resulted from circuit simulation.

FIG. 5B is a graph showing a plot of phase noise versus offset frequency of the frequency divider circuit of the invention 10 under the condition that the signal-input port (INPUT) is in idle state and receives no input signal. As shown, when the offset frequency is 1 MHz, the phase noise is about 101.2 dBc/Hz.

In conclusion, the direct injection-locked frequency divider circuit with inductive-coupling feedback architecture according to the invention has the following advantages:

First, since the signal-injection circuit 110 is based on a direct-injection architecture rather than tail injection for injecting the input signal to the ILO circuit module 100, the frequency divider circuit of the invention 10 can provide a higher operating frequency with a wider frequency locking range.

Second, since the first buffer-stage circuit 210 and the second buffer-stage circuit 220 are PMOS-based rather NMOS-based, it allows the use of a lower bias voltage and thus allows the operation of the frequency divider circuit of the invention 10 to consume less power. It can be demonstrated from experiments that the power consumption of the buffer-stage circuits 210 and 220 is only about 4.912 mW.

Third, since the variable-capacitance tuning circuit 130 is constructed on a gate-interconnected pair of NMOS transistors for providing the desired capacitance in the LC tuning circuit, rather than utilizing transistor parasitic capacitance, it allows the frequency divider circuit of the invention 10 to provide a wider frequency locking range for the input signal.

Fourth, since the inductive elements ($L_3$, $L_4$) of the buffer-stage circuits 210 and 220 (which are required because the buffer-stage circuits 210 and 220 are PMOS-based) are coupled to the inductive elements ($L_1$, $L_2$) of the variable-capacitance tuning circuit 130 to form an inductive-coupling (transformer-coupling) feedback architecture, it allows the use of a smaller IC layout area. In practice, if the invention is implemented with the 0.18 μm IC fabrication technology, the required chip size can be only 0.34 mm×0.45 mm.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A frequency divider circuit, comprising:
   an injection-locked oscillator circuit module, which has an input/output interface including a signal-input port for receiving an input signal, a control-voltage input port for receiving a tuning control voltage, and a pair of differential output ports including a positive differential output port and a negative differential output port for generating a differential pair of output signals; and whose internal architecture includes:
   a signal-injection circuit, which is based on a direct-injection architecture for injection of the input signal into the injection-locked oscillator circuit module;
   a cross-coupled switching circuit, which includes a cross-coupled switching elements, for providing a crossed switching function to the input signal;
   a variable-capacitance tuning circuit, which includes a voltage-controlled variable-capacitance circuit, a first inductive element, and a second inductive element, for providing a voltage-controlled variable-capacitance tuning function based on the control voltage received at the control-voltage input port;
   a first buffer-stage circuit, which is constructed on a PMOS-based circuit architecture having a third inductive element, for providing a buffer effect to the output signal generated at the positive differential output port; and wherein the third inductive element of the first buffer-stage circuit is coupled to the first inductive element of the variable-capacitance tuning circuit to constitute a first inductive-coupling feedback architecture; and
   a second buffer-stage circuit, which is constructed on a PMOS-based circuit architecture having a fourth inductive element, for providing a buffer effect to the output signal generated at the negative differential output port; and wherein the fourth inductive element of the second buffer-stage circuit is coupled to the second inductive element of the variable-capacitance tuning circuit to constitute a second inductive-coupling feedback architecture.

2. The frequency divider circuit of claim 1, wherein the signal-injection circuit is an NMOS transistor.

3. The frequency divider circuit of claim 1, wherein the cross-coupled switching circuit is implemented with a pair of cross-coupled PMOS transistors.

4. The frequency divider circuit of claim 1, wherein the variable-capacitance tuning circuit is implemented with a gate-interconnected pair of NMOS transistors.

* * * * *